United States Patent
Xiao

(10) Patent No.: US 10,770,478 B1
(45) Date of Patent: Sep. 8, 2020

(54) METHODS FOR FORMING THREE-DIMENSIONAL MEMORY DEVICE HAVING BENT BACKSIDE WORD LINES

(71) Applicant: YANGTZE MEMORY TECHNOLOGIES CO., LTD., Wuhan (CN)

(72) Inventor: Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/453,974

(22) Filed: Jun. 26, 2019

Related U.S. Application Data

(63) Continuation of application No. PCT/CN2019/085211, filed on Apr. 30, 2019.

(51) Int. Cl.
*H01L 27/11* (2006.01)
*H01L 21/02* (2006.01)
(Continued)

(52) U.S. Cl.
CPC .... *H01L 27/11582* (2013.01); *H01L 21/0217* (2013.01); *H01L 21/0228* (2013.01);
(Continued)

(58) Field of Classification Search
CPC .......... H01L 21/02164; H01L 21/0217; H01L 21/0228; H01L 21/02532; H01L 21/02595;
(Continued)

(56) References Cited

U.S. PATENT DOCUMENTS

| 9,659,956 B1 | 5/2017 | Pachamuthu et al. |
| 9,935,123 B2 | 4/2018 | Nishikawa et al. |
| (Continued) | | |

FOREIGN PATENT DOCUMENTS

| CN | 1177831 A | 4/1998 |
| CN | 102959693 A | 3/2013 |
| (Continued) | | |

OTHER PUBLICATIONS

International Search Report issued in corresponding International Application No. PCT/CN2019/085211, dated Jan. 23, 2020, 5 pages.
(Continued)

*Primary Examiner* — Sheikh Maruf
(74) *Attorney, Agent, or Firm* — Bayes PLLC

(57) ABSTRACT

Embodiments of methods for forming three-dimensional (3D) memory devices having bent backside word lines are disclosed. In an example, a method for forming a 3D memory device is disclosed. A notch is formed on at least one edge of a substrate. A semiconductor layer above the substrate and extending laterally beyond the at least one edge of the substrate is formed to cover the notch. A plurality of interleaved conductive layers and dielectric layers are formed along a front side and the at least one edge of the semiconductor layer and along a top surface, a side surface, and a bottom surface of the notch. A portion of the substrate is removed to expose the interleaved conductive layers and dielectric layers below the semiconductor layer.

20 Claims, 9 Drawing Sheets

(51) Int. Cl.
  *H01L 27/11582* (2017.01)
  *H01L 23/544* (2006.01)
  *H01L 21/311* (2006.01)
  *H01L 21/3213* (2006.01)
  *H01L 29/66* (2006.01)
  *H01L 21/285* (2006.01)

(52) U.S. Cl.
  CPC .. *H01L 21/02164* (2013.01); *H01L 21/02532* (2013.01); *H01L 21/02595* (2013.01); *H01L 21/28525* (2013.01); *H01L 21/31111* (2013.01); *H01L 21/32133* (2013.01); *H01L 23/544* (2013.01); *H01L 29/66545* (2013.01); *H01L 2223/54493* (2013.01)

(58) Field of Classification Search
  CPC ......... H01L 21/28525; H01L 21/31111; H01L 21/32133
  USPC .......................................................... 438/269
  See application file for complete search history.

(56) References Cited

U.S. PATENT DOCUMENTS

| | | | |
|---|---|---|---|
| 10,211,215 B1* | 2/2019 | Ishii | H01L 23/5226 |
| 2005/0282356 A1 | 12/2005 | Lee | |
| 2013/0307159 A1 | 11/2013 | Safran et al. | |
| 2015/0145020 A1* | 5/2015 | Kim | H01L 29/7889 |
| | | | 257/324 |
| 2015/0236039 A1* | 8/2015 | Kim | H01L 29/40117 |
| | | | 438/269 |
| 2015/0262826 A1* | 9/2015 | Yun | H01L 27/11568 |
| | | | 438/269 |
| 2015/0325587 A1 | 11/2015 | Chen | |
| 2016/0071876 A1* | 3/2016 | Mizuno | G11C 16/26 |
| | | | 365/185.17 |
| 2016/0111439 A1* | 4/2016 | Tsutsumi | H01L 27/11556 |
| | | | 257/316 |
| 2016/0118391 A1* | 4/2016 | Zhao | H01L 29/16 |
| | | | 257/66 |
| 2016/0163725 A1 | 6/2016 | Kamiya et al. | |
| 2016/0172370 A1* | 6/2016 | Makala | H01L 27/11524 |
| | | | 257/314 |
| 2016/0276268 A1 | 9/2016 | Yada et al. | |
| 2016/0379989 A1* | 12/2016 | Sharangpani | H01L 29/40114 |
| | | | 257/314 |
| 2017/0062454 A1 | 3/2017 | Lu et al. | |
| 2017/0243877 A1 | 8/2017 | Inatsuka | |
| 2018/0350830 A1* | 12/2018 | Lim | H01L 29/1037 |
| 2019/0280004 A1* | 9/2019 | Takamura | H01L 23/5226 |
| 2019/0287983 A1 | 9/2019 | Koyama | |

FOREIGN PATENT DOCUMENTS

| | | | |
|---|---|---|---|
| CN | 202905470 U | | 4/2013 |
| CN | 108886039 A | | 11/2018 |
| CN | 108933139 A | | 12/2018 |
| CN | 109155316 A | | 1/2019 |
| CN | 109219885 A | | 1/2019 |
| CN | 109643718 A | | 4/2019 |
| CN | 109686738 A | | 4/2019 |
| CN | 109690774 A | * | 4/2019 |
| CN | 109690774 A | | 4/2019 |
| CN | 109690775 A | | 4/2019 |
| TW | 200901391 A | | 1/2009 |
| TW | 201913962 A | | 4/2019 |

OTHER PUBLICATIONS

Written Opinion of the International Searching Authority issued in corresponding International Application No. PCT/CN2019/085211, dated Jan. 23, 2020, 5 pages.
International Search Report issued in corresponding International Application No. PCT/CN2019/085210, dated Feb. 3, 2020, 5 pages.
Written Opinion of the International Searching Authority issued in corresponding International Application No. PCT/CN2019/085210, dated Feb. 3, 2020, 5 pages.

* cited by examiner

US 10,770,478 B1

METHODS FOR FORMING THREE-DIMENSIONAL MEMORY DEVICE HAVING BENT BACKSIDE WORD LINES

CROSS REFERENCE TO RELATED APPLICATION

This application is continuation of International Application No. PCT/CN2019/085211, filed on Apr. 30, 2019, entitled "METHODS FOR FORMING THREE-DIMENSIONAL MEMORY DEVICE HAVING BENT BACKSIDE WORD LINES," which is hereby incorporated by reference in its entirety. This application is also related to U.S. application Ser. No. 16/453,967, filed on even date, entitled "THREE-DIMENSIONAL MEMORY DEVICE HAVING BENT BACKSIDE WORD LINES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of methods for forming 3D memory devices having bent backside word lines are disclosed herein.

In one example, a method for forming a 3D memory device is disclosed. A notch is formed on at least one edge of a substrate. A semiconductor layer above the substrate and extending laterally beyond the at least one edge of the substrate is formed to cover the notch. A plurality of interleaved conductive layers and dielectric layers are formed along a front side and the at least one edge of the semiconductor layer and along a top surface, a side surface, and a bottom surface of the notch. A portion of the substrate is removed to expose the interleaved conductive layers and dielectric layers below the semiconductor layer.

In another example, a method for forming a 3D memory device is disclosed. A notch is formed on at least one edge of a substrate. A semiconductor layer above the substrate and extending laterally beyond the at least one edge of the substrate is formed to cover the notch. A plurality of sacrificial layers and dielectric layers are alternatingly deposited along a front side and the at least one edge of the semiconductor layer and along a top surface, a side surface, and a bottom surface of the notch. A portion of the substrate is removed to expose the interleaved sacrificial layers and dielectric layers below the semiconductor layer. The sacrificial layers are replaced with a plurality of conductive layers.

In still another example, a method for forming a 3D memory device is disclosed. A notch is formed on at least one edge of a substrate. A semiconductor layer above the substrate and extending laterally beyond the at least one edge of the substrate is formed to cover the notch. A plurality of conductive layers and dielectric layers are alternatingly deposited along a front side and the at least one edge of the semiconductor layer and along a top surface, a side surface, and a bottom surface of the notch. A portion of the substrate is removed to expose the interleaved conductive layers and dielectric layers below the semiconductor layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
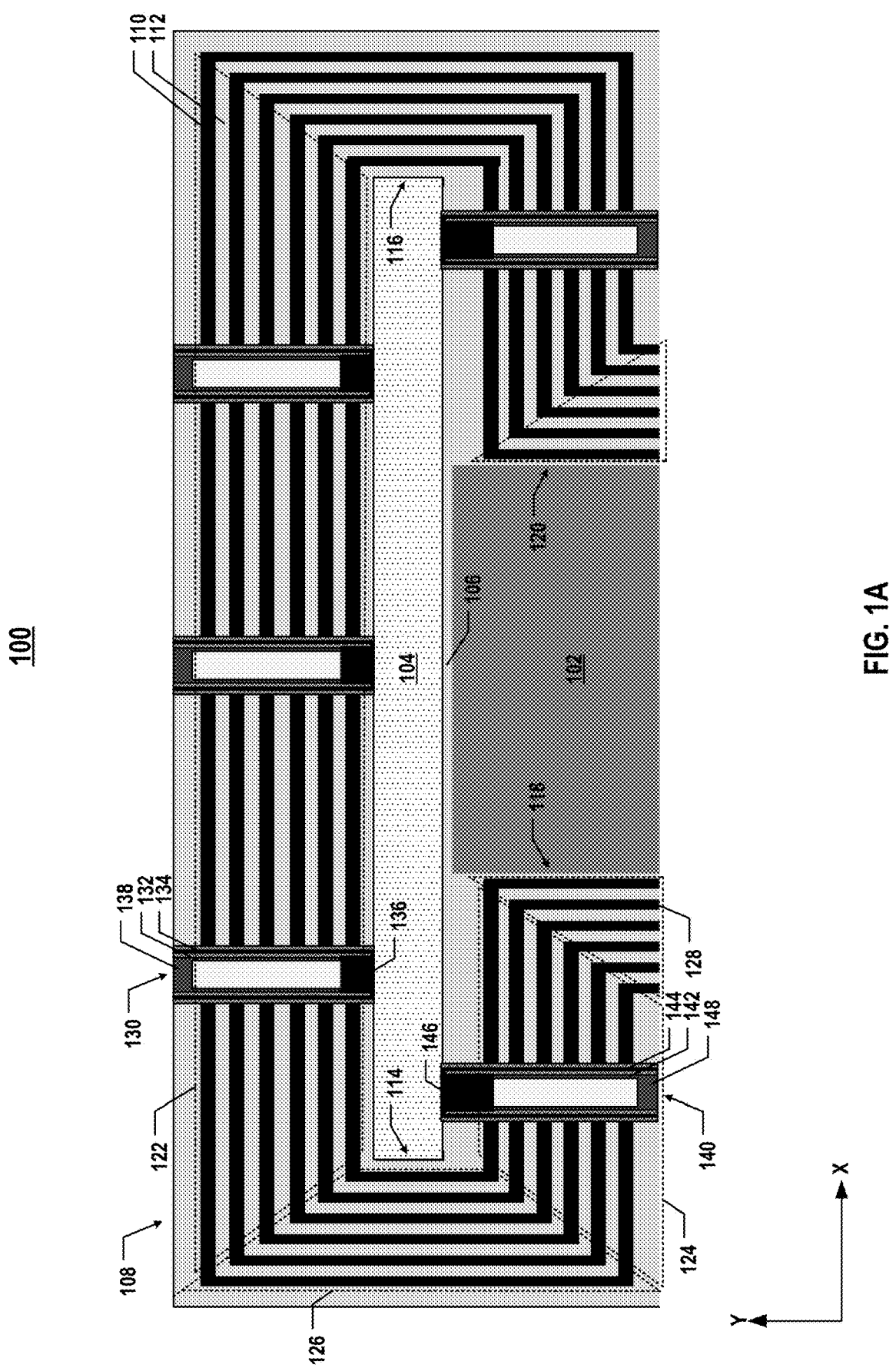
FIG. 1A illustrates a cross-section of an exemplary 3D memory device having bent backside word lines, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices (e.g., 3D NAND memory devices), staircase structures are required for contacts to land on and electrically connect each word line individually to operate memory cell program, erase, and read sequences. Peripheral circuits are around, under, or over memory cell array and electrically connected by peripheral contacts. As 3D memory devices scale for lower cost and higher cell density, the natural way to reduce cost and increase cell density is adding more layers in the memory stack. However, adding layers also increases the size of the staircase structures used to access the word lines, which reduces the core array area for memory cells on the chip. Moreover, more word line contacts formed on the front side of the memory stack increases the complexity of interconnect routing (e.g., word line fan-out).

Various embodiments in accordance with the present disclosure provide 3D memory devices having bent backside word lines. The memory stack structures disclosed herein allow interconnect routing (e.g., word line fan-out) toward both sides of the device substrate, thereby increasing routing flexibility, reducing interconnect density, saving chip area for core array, and enlarging process window. In some embodiments, memory cells (e.g., 3D NAND memory strings) are formed through the memory stack on both sides of the device substrate, which also increases memory cell density. Moreover, word line contacts can be formed together with the word lines as a whole without dedicated contact formation processes to reduce cost and achieve better electrical performance with lower interface resistance between word line contacts and word lines.

FIG. 1A illustrates a cross-section of an exemplary 3D memory device 100 having bent backside word lines, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials. In some embodiments, substrate 102 is a thinned substrate, which was thinned from a normal thickness by grinding, wet/dry etching, chemical mechanical polishing (CMP), or any combination thereof. In some embodiments, substrate 102 is a carrier wafer (a.k.a. support wafer) that does not include any semiconductor device formed thereon, which, for example, may include glass or quartz.

3D memory device 100 can include a semiconductor layer 104 above and extending laterally beyond at least one edge 118/120 of substrate 102. As shown in FIG. 1A, semiconductor layer 104 extends laterally beyond both edges 118 and 120 of substrate 102. It is noted that x and y axes are added to FIG. 1A to further illustrate the spatial relationship of the components in 3D memory device 100. Substrate 102 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (the vertical direction or thickness direction) when the substrate is positioned in the lowest plane of the semiconductor device in the y-direction. The same notion for describing spatial relationship is applied throughout the present disclosure.

Semiconductor layer 104 can include silicon (e.g., polysilicon, amorphous silicon, single-crystal silicon), silicon germanium (SiGe), gallium arsenide (GaAs), germanium (Ge), or any other suitable semiconductor materials. In some embodiments, semiconductor layer 104 includes polysilicon. A part or an entirety of semiconductor layer 104 is doped by any suitable dopants at desired doping levels, according to some embodiments. For example, semiconductor layer 104 may be a doped polysilicon layer. In some embodiments, the thickness of semiconductor layer 104 is not greater than about 1 μm, such as 1 μm. In some embodiments, the thickness of semiconductor layer 104 is between about 10 nm and about 1 μm, such as between 10 nm and 1 μm (e.g., 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, any range bounded by the lower end by any of these values, or any range defined by any two of these values). In some embodiments, the distance of semiconductor layer 104 extending beyond substrate 102 (i.e., the distance between edge 114 or 116 of semiconductor layer 104 and respective edge 118 or 120 of substrate 102) is between about 5 μm and about 10 μm, such as between 5 μm and 10 μm (e.g., 5 μm, 6 μm, 7 μm, 8 μm, 9 μm, 10 μm, any range bounded by the lower end by any of these values, or any range defined by any two of these values).

Semiconductor layer 104 can work as the source (e.g., array common source (ACS)) of 3D memory device 100 as well as the supporting structure to form double-side bent word lines as described below in detail. Semiconductor layer 104 thus can be referred to herein as a "source plate" 104 of 3D memory device 100 as well.

In some embodiments, 3D memory device 100 further includes a pad layer 106 disposed between substrate 102 and semiconductor layer 104. Pad layer 106 can include silicon oxide. In some embodiments, pad layer 106 is a composite dielectric layer including multiple dielectric layers, such as multiple silicon oxide layers or a silicon oxide layer with a silicon oxide layer, a silicon oxynitride layer, and/or a high dielectric constant (high-k) dielectric layer.

3D memory device 100 can also include a memory stack 108. Memory stack 108 can be a stacked storage structure through which memory strings (e.g., NAND memory strings 130 and 140) are formed. In some embodiments, memory stack 108 includes a plurality of interleaved conductive layers 110 and dielectric layers 112 stacked vertically. In some embodiments, 3D memory device 100 is a NAND Flash memory device in which memory cells are provided at intersections of NAND memory strings 130 and 140 and conductive layers 110 of 3D memory device 100. The number of pairs of conductive layers 110 and dielectric layers 112 in memory stack 108 (e.g., 32, 64, 96, or 128) can set the number of memory cells in 3D memory device 100.

Conductive layers 110 can each have the same thickness or have different thicknesses. Similarly, dielectric layers 112 can each have the same thickness or have different thicknesses. Conductive layers 110 can include conductive materials including, but not limited to, tungsten (W), cobalt (Co), copper (Cu), aluminum (Al), polycrystalline silicon (polysilicon), doped silicon, silicides, or any combination thereof. In one example, each conductive layer 110 includes a metal, such as tungsten. In another example, each conductive layer 110 includes doped polysilicon. Dielectric layers 112 can include dielectric materials including, but not limited to, silicon oxide, silicon nitride, silicon oxynitride, or any combination thereof. In one example, each dielectric layer 112 includes silicon oxide.

As shown in FIG. 1A, interleaved conductive layers 110 and dielectric layers 112 of memory stack 108 are above the front side of semiconductor layer (source plate) 104 and extend below the back side of semiconductor layer (source plate) 104, according to some embodiments. The front side of semiconductor layer (source plate) 104 referred to herein is one of the two main sides (as extending between two edges 114 and 116) of semiconductor layer (source plate) 104 that is farther away from substrate 102 in the y-direction, while the back side of semiconductor layer (source plate) 104 referred to herein is one of the two main sides (as extending between two edges 114 and 116) of semiconductor layer (source plate) 104 that is closer to substrate 102 in the y-direction. Each conductive layer 110 and dielectric layer 112 can extend laterally beyond at least one edge 114/116 of semiconductor layer (source plate) 104 at the front side of semiconductor layer (source plate) 104. As shown in FIG. 1A, in some embodiments, each conductive layer 110 and dielectric layer 112 can extend laterally beyond both edges 114 and 116 of semiconductor layer (source plate) 104 at the front side of semiconductor layer (source plate) 104. That is, the dimensions of each conductive layer 110 and dielectric layer 112 are greater than the dimension of semiconductor layer (source plate) 104 in the x-direction, which is in turn greater than the dimension of substrate 102 in the x-direction, according to some embodiments. Memory stack 108 thus can extend over and beyond the entire front side of semiconductor layer (source plate) 104 in the x-direction.

In some embodiments, interleaved conductive layers 110 and dielectric layers 112 of memory stack 108 extend vertically along at least one edge 114/116 of semiconductor layer (source plate) 104. As shown in FIG. 1A, interleaved conductive layers 110 and dielectric layers 112 of memory stack 108 can extend vertically along both edges 114 and 116 of semiconductor layer (source plate) 104. In some embodiments, interleaved conductive layers 110 and dielectric layers 112 of memory stack 108 further extend below the back side of semiconductor layer (source plate) 104. That is, substrate 102 and part of interleaved conductive layers 110 and dielectric layers 112 of memory stack 108 are disposed below the back side of semiconductor layer (source plate) 104, according to some embodiments. In some embodiments, parts of interleaved conductive layers 110 and dielectric layers 112 of memory stack 108 are disposed on left and right sides of substrate 102 in the x-direction. In other words, memory stack 108 extends over part of, but not the entirety of, the back side of semiconductor layer (source plate) 104 in the x-direction, according to some embodiments.

As shown in FIG. 1A, each conductive layer 110 and dielectric layer 112 can have a continuous bent shape in the side view including a first lateral portion 122 above the front side of semiconductor layer (source plate) 104, a second lateral portion 124 below the back side of semiconductor layer (source plate) 104, and a vertical portion 126 connecting first and second lateral portions 122 and 124. In some embodiments, first lateral portion 122 of each conductive layer 110 or dielectric layer 112 is longer than second lateral portion 124 of each conductive layer 110 or dielectric layer 112, respectively, in the x-direction. In some embodiments, vertical portion 126 of each conductive layer 110 or dielectric layer 112 is longer than the thickness of semiconductor layer (source plate) 104 in the y-direction. First and second lateral portions 122 and 124 and vertical portion 126 of each conductive layer 110 can form (e.g., function as) a bent word line extending between the front side and the back side of semiconductor layer (source plate) 104. Each bent word line of 3D memory device 100 can extend laterally beyond both edges 114 and 116 of semiconductor layer (source plate) 104 at the front side of semiconductor layer (source plate) 104, for example, by first lateral portion 122 thereof. Each bent word line can extend vertically along at least one edge 114/116 of semiconductor layer (source plate) 104, for example, by vertical portion 126 thereof. As shown in FIG. 1A, in some embodiments, each bent word line extends vertically along both edges 114 and 116 of semiconductor layer (source plate) 104. Different from some existing 3D memory devices having straight word lines disposed only on the front side, 3D memory device 100 includes bent word lines extending between the front side and the back side.

Each conductive layer 110 of 3D memory device 100 can be a continuous layer made of the same conductive material including, but not limited to, a metal or doped polysilicon. Besides the bent word line, each conductive layer 110 further includes a word line contact 128 connected to the bent word line and extending vertically below the back side of semiconductor layer (source plate) 104, according to some embodiments. As shown in FIG. 1A, conductive layers 110 can further extend vertically below the back side of semiconductor layer (source plate) 104 to form (e.g., function as) a plurality of word line contacts 128. Each word line contact 128 extends vertically (e.g., in the y-direction) on the back side of 3D memory device 100 for word line fan-out. Different from some existing 3D memory devices having separate word lines and word line contacts, 3D memory device 100 includes conductive layers 110, each of which is a continuous layer made of the same conductive material, functioning as both word lines and word line contacts.

As shown in FIG. 1A, 3D memory device 100 can include a plurality of NAND memory strings 130 and 140 each extending vertically through interleaved conductive layers 110 and dielectric layers 112. Each NAND memory string 130 or 140 is in contact with semiconductor layer (source plate) 104, according to some embodiments. NAND memory strings 130 and 140 can be disposed above the front side of semiconductor layer (source plate) 104 (referred to herein as front NAND memory strings 130) and below the back side of semiconductor layer (source plate) 104 (referred to herein as back NAND memory strings 140). Each front NAND memory string 130 can include a channel hole filled with semiconductor materials (e.g., forming a semiconductor channel 132) and dielectric materials (e.g., forming a memory film 134). In some embodiments, semiconductor channel 132 includes silicon, such as amorphous silicon, polysilicon, or single crystalline silicon. In some embodiments, memory film 134 is a composite layer including a tunneling layer, a storage layer (also known as a "charge trap/storage layer"), and a blocking layer. Each front NAND memory string 130 can have a cylinder shape (e.g., a pillar shape). Semiconductor channel 132, the tunneling layer, the storage layer, and the blocking layer of memory film 134 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof.

In some embodiments, each front NAND memory string 130 further includes a semiconductor plug 136 in the lower portion (e.g., at the lower end) of the channel hole. Semiconductor plug 136 can include a semiconductor material, such as polysilicon. Semiconductor plug 136 can be in contact with semiconductor layer (source plate) 104 and function as a channel controlled by a source select gate of front NAND memory string 130. In some embodiments, each front NAND memory string 130 further includes a channel plug 138 in the upper portion (e.g., at the upper end) of the channel hole. In some embodiments, channel plug 138 can function as the drain of front NAND memory string 130.

Different from some existing 3D memory devices only having front NAND memory strings, 3D memory device 100 can also include back NAND memory strings 140 disposed below the back side of semiconductor layer (source plate) 104 as the bent word lines can extend below the back side of semiconductor layer (source plate) 104. Similar to front NAND memory strings 130, each back NAND memory string 140 includes a semiconductor channel 142 and a memory film 144. Each back NAND memory string 140 can have a cylinder shape (e.g., a pillar shape). Semiconductor channel 142, the tunneling layer, the storage layer, and the blocking layer of memory film 144 are arranged radially from the center toward the outer surface of the pillar in this order, according to some embodiments.

In some embodiments, each back NAND memory string 140 further includes a semiconductor plug 146 in the upper portion (e.g., at the upper end) of the channel hole. Semiconductor plug 146 can include a semiconductor material, such as polysilicon. Semiconductor plug 146 can be in contact with semiconductor layer (source plate) 104 and function as a channel controlled by a source select gate of back NAND memory string 140. In some embodiments, each back NAND memory string 140 further includes a channel plug 148 in the lower portion (e.g., at the lower end) of the channel hole. In some embodiments, channel plug 148 can function as the drain of back NAND memory string 140.

In some embodiments, 3D memory device 100 is part of a monolithic 3D memory device, in which the components of the monolithic 3D memory device (e.g., memory cells and peripheral devices) are formed on a single substrate (e.g., substrate 102). Peripheral devices (not shown), such as any suitable digital, analog, and/or mixed-signal peripheral circuits used for facilitating the operation of 3D memory device 100, can be formed above memory stack 108. In some embodiments, 3D memory device 100 is part of a non-monolithic 3D memory device, in which the components are formed separately on different substrates and then bonded in a face-to-face manner, a face-to-back manner, or a back-to-back manner Peripheral devices (not shown) can be formed on a separate substrate different from substrate 102. As part of a bonded non-monolithic 3D memory device, substrate 102 can be a thinned substrate (which is not the substrate of the bonded non-monolithic 3D memory device), and the back-end-of-line (BEOL) interconnects of the non-monolithic 3D memory device can be formed on the back side of thinned substrate 102. Nevertheless, 3D memory device 100 can be part of a monolithic or non-monolithic 3D memory device regardless of whether 3D memory device 100 is above or below the peripheral devices (not shown). For ease of reference, FIG. 1A depicts a state of 3D memory device 100 in which substrate 102 is positioned below semiconductor layer (source plate) 104 in the y-direction. It is also understood that although not shown in FIG. 1A, additional components of 3D memory device 100 can be formed as part of 3D memory device 100 including, but not limited to, gate line slits/source contacts, dummy channels, local interconnects, interconnect layers (e.g., BEOL interconnects), etc.

Figure 1B:
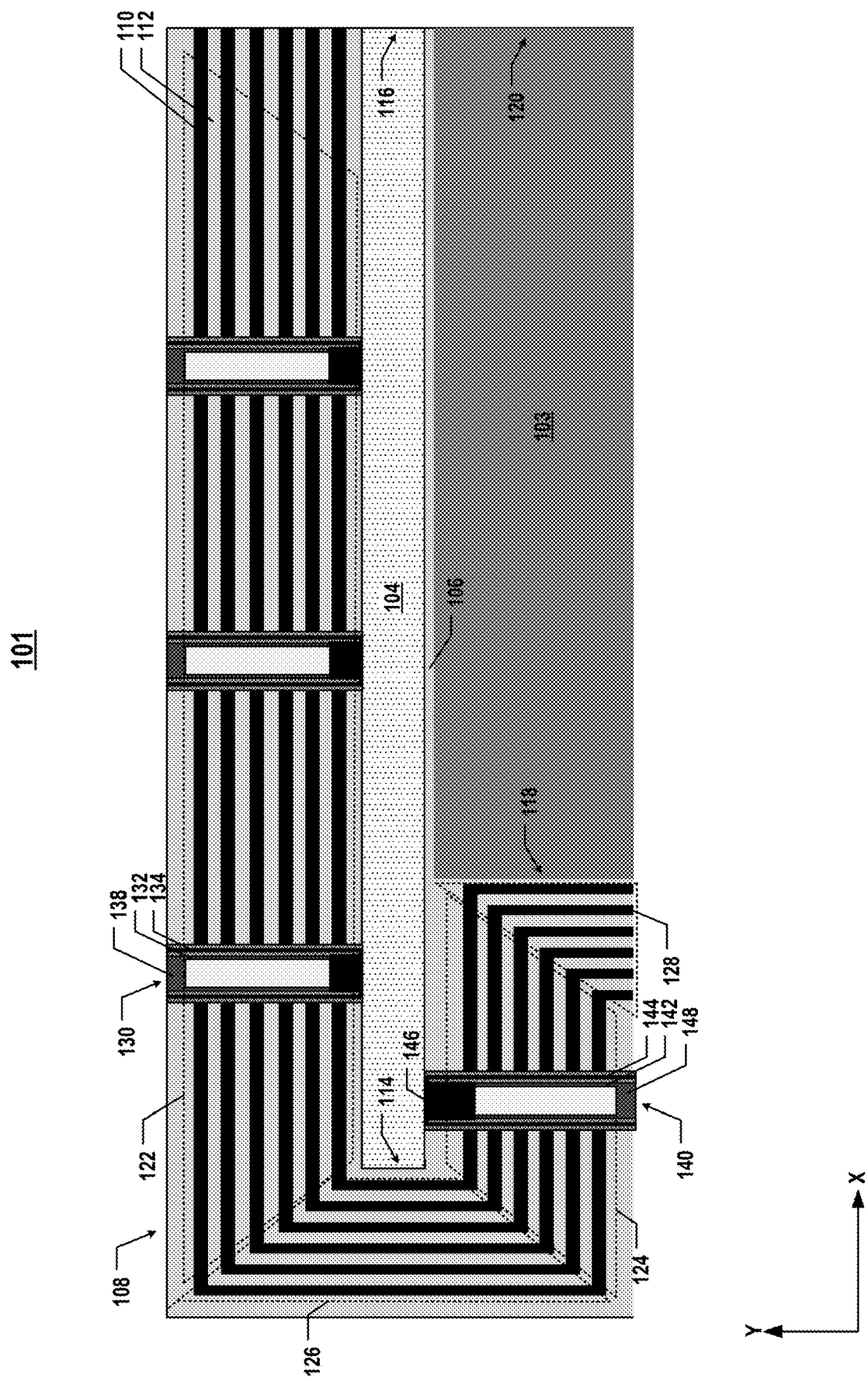
FIG. 1B illustrates a cross-section of another exemplary 3D memory device having bent backside word lines, according to some embodiments.

FIG. 1B illustrates a cross-section of another exemplary 3D memory device 101 having bent backside word lines, according to some embodiments. Different from FIG. 1A in which the bent word lines formed along both edges 114 and 116 of semiconductor layer (source plate) 104, 3D memory device 101 in FIG. 1B includes bent word lines formed along one edge 114 of semiconductor layer (source plate) 104. The remaining components of 3D memory device 101 are substantially similar to their counterparts in 3D memory device 100 in FIG. 1A and thus, will not be repeated in detail herein.

As shown in FIG. 1B, semiconductor layer (source plate) 104 above a substrate 103 extends laterally beyond one edge 118 of substrate 103, according to some embodiments. One edge 116 of semiconductor layer (source plate) 104 can be aligned with another edge 120 of substrate 103. As a result, each conductive layer 110 and dielectric layer 112 extends laterally beyond one edge 114, but not another edge 116, of semiconductor layer (source plate) 104 at the front side of semiconductor layer (source plate) 104, according to some embodiments. Interleaved conductive layers 110 and dielectric layers 112 can extend vertically along one edge 114, but not another edge 116, of semiconductor layer (source plate) 104. Accordingly, the bent word line (including first and second lateral portions 122 and 124 and vertical portion 126 of conductive layer 110) extends laterally beyond one edge 114, but not another edge 116, of semiconductor layer (source plate) 104 at the front side of semiconductor layer (source plate) 104, according to some embodiments. The bent word line can extend vertically along one edge 114, but not another edge 116, of semiconductor layer (source plate) 104. Besides the bent word line, each conductive layer 110 further includes a plurality of word line contacts 128 connected to the bent word line and extending vertically below the back side of semiconductor layer (source plate) 104, according to some embodiments.

FIGS. 2A-2G illustrate a fabrication process for forming an exemplary 3D memory device having bent backside word lines, according to some embodiments. FIG. 3 is a flowchart of a method for forming an exemplary 3D memory device having bent backside word lines, according to some embodiments. Examples of the 3D memory device depicted in FIGS. 2A-2G and FIG. 3 include 3D memory device 100 depicted in FIG. 1A. FIGS. 2A-2G and FIG. 3 will be described together. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a notch is formed on at least one edge of a substrate. In some embodiments, two notches are formed on both edges of the substrate, respectively. The depth of the notch can be greater than twice of the combined thickness of the conductive layer and the dielectric layer.

Figure 2A:
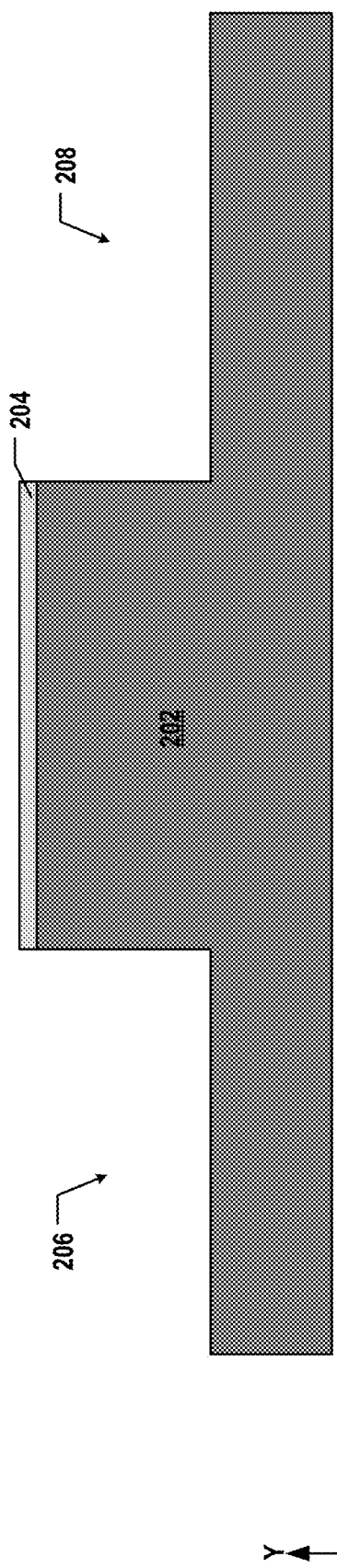
FIGS. 2A-2G illustrate a fabrication process for forming an exemplary 3D memory device having bent backside word lines, according to some embodiments.
Figure 3:
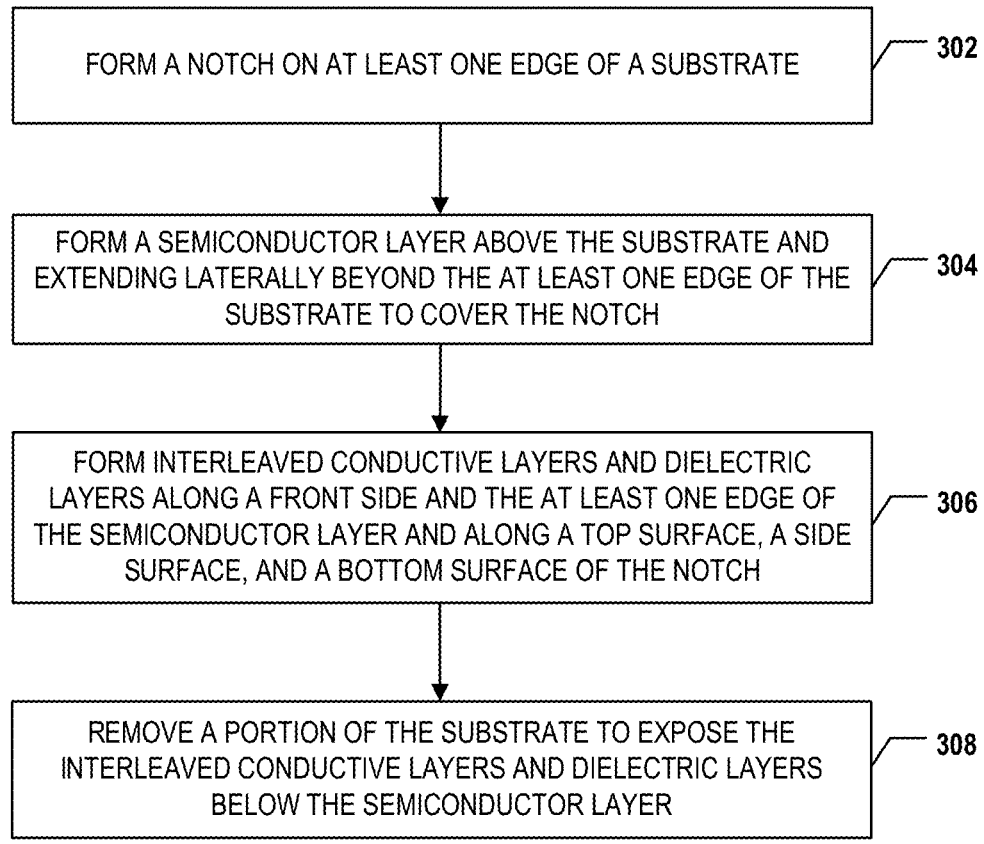
FIG. 3 is a flowchart of a method for forming an exemplary 3D memory device having bent backside word lines, according to some embodiments.

As illustrated in FIG. 2A, a pad layer 204 is formed on a substrate 202. Substrate 202 can be a silicon substrate or a carrier wafer. Pad layer 204 can include silicon oxide, such as tetraethyl orthosilicate (TEOS) silicon oxide, or any other dielectric materials including, but not limited to, silicon nitride, silicon oxynitride, or any combination thereof. Pad layer 204 can be formed by one or more thin film deposition processes including, but not limited to, in-situ steam generation (ISSG), chemical vapor deposition (CVD), physical vapor deposition (PVD), atomic layer deposition (ALD), spin coating, or any combination thereof. A photoresist layer (not shown) can be formed on pad layer 204 by spin coating. The photoresist layer can be any suitable type of positive or negative photoresist. In some embodiments, a hard mask layer (e.g., an amorphous carbon film), a bottom anti-reflection coating (BARC) film, and/or a dielectric anti-reflection coating (DARC) film are formed between pad layer 204 and the photoresist layer.

The photoresist layer can be patterned by photolithography and development and used as an etch mask to etch the exposed portions of pad layer 204 and substrate 202 by wet etch and/or dry etch. Any suitable etchants (e.g., of wet etch and/or dry etch) can be used to remove the entire thickness of pad layer 204 and a certain thickness of substrate 202 in the exposed portions to form two notches 206 and 208 (e.g., deep trench isolations (DTIs)) on both edges of substrate 202, respectively, e.g., for forming 3D memory device 100 as shown in FIG. 1A. The width of each notch 206 or 208 in the x-direction can be controlled by the patterned photoresist layer. It is understood that in some embodiments, the photoresist layer can be patterned to cover one of notches 206 and 208 such that only one notch 206 or 208 may be formed on one edge of substrate 202, e.g., for forming 3D memory device 101 as shown in FIG. 1B. For ease of description, FIGS. 2A-2G illustrate a fabrication process involving two notches 206 and 208 on both edges of substrate 202, respectively. The same process can be used for fabricating 3D memory device 101 as shown in FIG. 1B involving only one notch on one edge of substrate 202.

The depth of each notch 206 or 208 in the y-direction can be nominally the same. The depth (e.g., the etched thickness of substrate 202) can be controlled by etch rate and/or etch time. In some embodiments, the depth of each notch 206 or 208 is greater than twice of the combined thickness of the conductive layer and the dielectric layer to be formed in the memory stack. For example, if the combined thickness of the conductive layer and the dielectric layer is 5 μm, then the depth of each notch 206 or 208 may be greater than 10 μm. In some embodiments, it is desirable to have the sidewall profile of each notch 206 or 208 as straight as possible by any suitable anisotropic etching processes for substrate 202, such as reactive ion etching (RIE). After forming notches 206 and 208, one or more remaining layers above pad layer 204 (e.g., the photoresist layer) can be removed by one or more etching processes to expose pad layer 204, as shown in FIG. 2A.

Method 300 proceeds to operation 304, as illustrated in FIG. 3, in which a semiconductor layer above the substrate and extending laterally beyond the at least one edge of the substrate is formed to cover the notch. In some embodiments, to form the semiconductor layer, the notch is filled with a notch sacrificial layer, the semiconductor layer is deposited above the substrate and the notch sacrificial layer, and the notch sacrificial layer in the notch is removed.

Figure 2B:
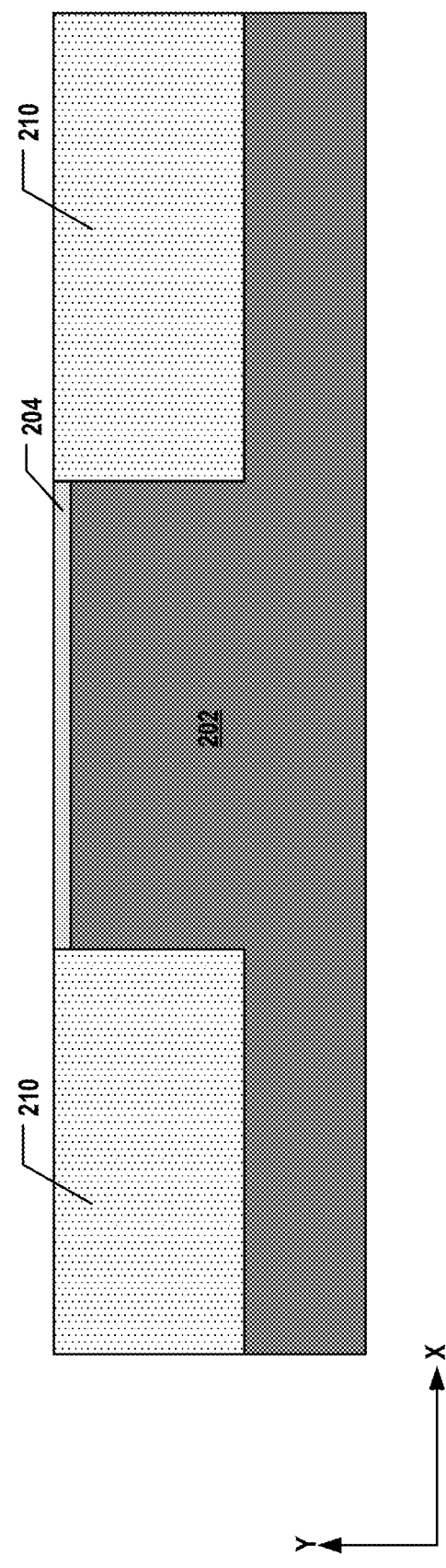

As illustrated in FIG. 2B, each notch 206 or 208 (as shown in FIG. 2A) is filled with a notch sacrificial layer 210. Notch sacrificial layer 210 can include any material having a high etching (wet or dry etching) selectivity to the material of substrate 202. For example, substrate 202 may be a silicon substrate, and notch sacrificial layer 210 may include silicon oxide, carbon, polymer, or photoresist. In some embodiments, notch sacrificial layer 210 is formed by one or more thin film deposition processes including, but not limited to, CVD, PVD, ALD, electroplating, electrodeless plating, spin coating, or any combination thereof, followed by a planarization process, such as CMP, to remove excess notch sacrificial layer 210 outside of notches 206 or 208. As a result, notch sacrificial layer 210 can be formed only in notches 206 and 208 and fill each notch 206 or 208 such that the top surface of notch sacrificial layer 210 is flush with the top surface of pad layer 204, as shown in FIG. 2B.

Figure 2C:
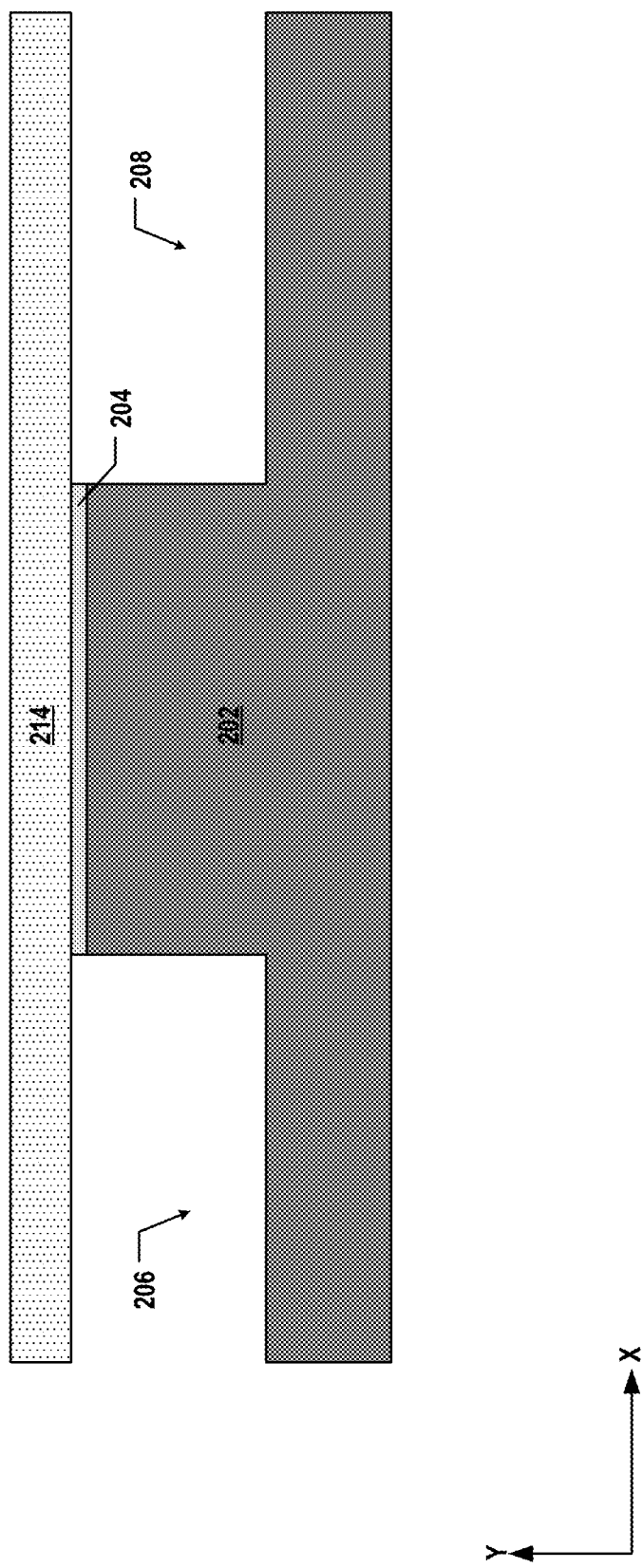

As illustrated in FIG. 2C, a semiconductor layer 214 is formed above substrate 202 and extending laterally beyond both edges of substrate 202 to cover notches 206 and 208. Semiconductor layer 214 includes polysilicon, according to some embodiments. In some embodiments, semiconductor layer 214 is deposited on pad layer 204 and notch sacrificial layer 210 (as shown in FIG. 2B) by one or more thin film deposition processes including, but not limited to, CVD, PVD, ALD, electroplating, electrodeless plating, or any combination thereof. Notch sacrificial layer 210 in notches 206 and 208 then can be removed by, for example, wet etching, dry etching, polymer ashing, photoresist stripping, etc., depending on the material of notch sacrificial layer 210. In some embodiments, part of semiconductor layer 214 at both edges thereof is removed to expose notch sacrificial layer 210 underneath, so that the etchants can be applied to notch sacrificial layer 210. The removed part of semiconductor layer 214 can be patterned by another etch mask, e.g., another photoresist layer, formed above. As a result, notches 206 and 208 can be re-opened as shown in FIG. 2C. The top surface of each notch 206 or 208 is formed by semiconductor layer 214, and the bottom surface and a side surface of each notch 206 or 208 is formed by substrate 202, according to some embodiments. In some embodiments, semiconductor layer 214 is doped by any suitable dopants at the desired doping level using ion implantation and/or thermal diffusion.

Method 300 proceeds to operation 306, as illustrated in FIG. 3, in which a plurality of interleaved conductive layers and dielectric layers are formed along a front side and the at least one edge of the semiconductor layer and along a top surface, a side surface, and a bottom surface of the notch. In some embodiments, the plurality of conductive layers and dielectric layers are alternatingly deposited, for example, using ALD. In some embodiments, each of the conductive layers includes doped polysilicon, and each of the dielectric layers includes silicon oxide.

Figure 2D:
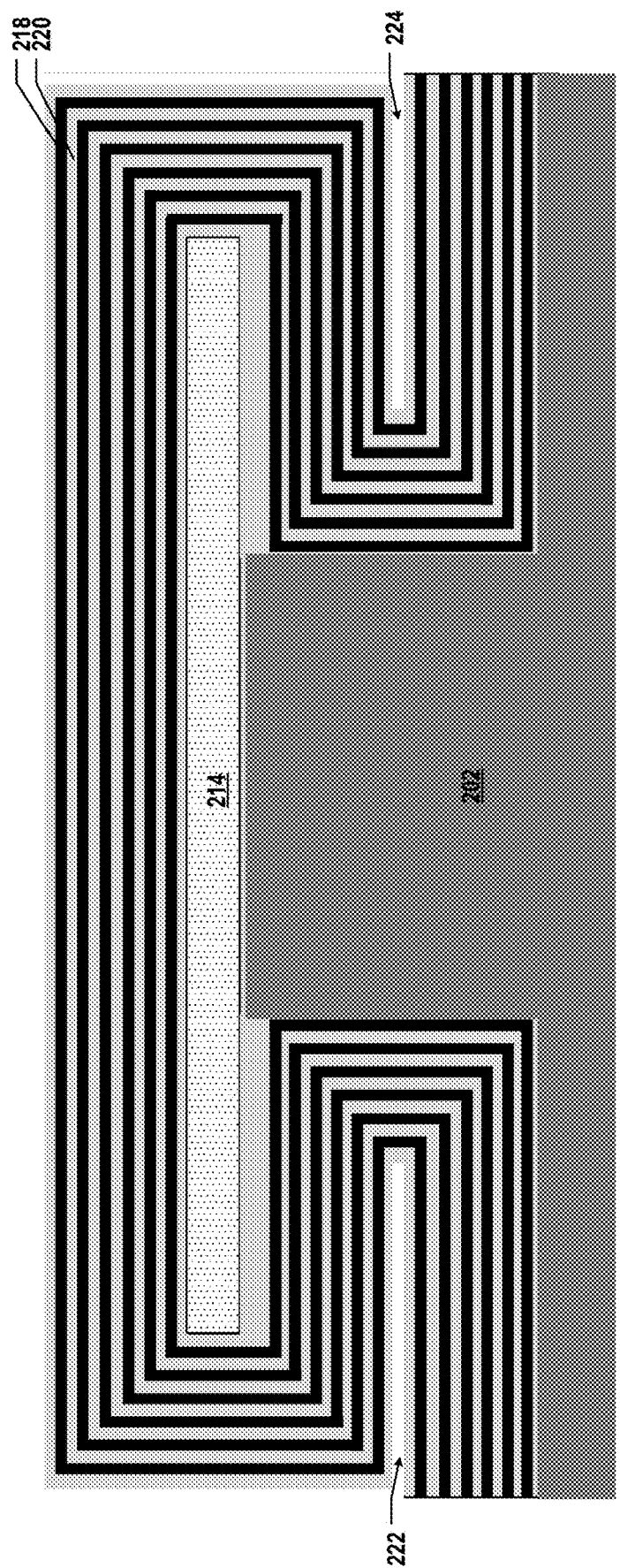

As illustrated in FIG. 2D, a plurality of conductive layers 218 and dielectric layers 220 are formed along the front side and both edges of semiconductor layer 214 and along the top surface, the side surface, and the bottom surface of each notch 206 or 208 (as shown in FIG. 2C). Each conductive layer 218 can include a metal or doped polysilicon, and each dielectric layer 220 can include silicon oxide, silicon nitride, and/or silicon oxynitride. In some embodiments, each conductive layer 218 includes doped polysilicon, and each dielectric layer 220 includes silicon oxide. Conductive layers 218 and dielectric layers 220 can be alternatingly deposited by one or more thin film deposition processes including, but not limited to, CVD, PVD, ALD, electroplating, electrodeless plating, or any combination thereof. The deposition rate and/or deposition time can be controlled to control the thickness of each conductive layer 218 and each dielectric layer 220. In some embodiments, the combined thickness of each pair of conductive layer 218 and dielectric layer 220 is nominally the same. As described above, the combined thickness of each pair of conductive layer 218 and dielectric layer 220 is less than one half of the depth of each notch 206 or 208 such that at least one pair of conductive layer 218 and dielectric layer 220 can be formed in notches 206 and 208, as illustrated in FIG. 2D, according to some embodiments.

In some embodiments, conductive layers 218 and dielectric layers 220 are alternatingly deposited using ALD. ALD is a thin-film deposition technique based on the sequential use of a gas phase chemical process to expose the surface to alternate gaseous species (precursors). ALD can be used for producing very thin, conformal films with control of accurate thickness and composition of the films as well as uniform film surface possible at the atomic level. Conductive layers 218 and dielectric layers 220 with well-controlled thickness and surface uniformity can be deposited using ALD along the front side and both edges of semiconductor layer 214 as well as along the top surface, the side surface, and the bottom surface of each notch 206 or 208. That is, a stack of continuous layers can be conformally deposited, following the profiles of semiconductor layer 214 and substrate 202, using ALD. In some embodiments, part of each notch 206 or 208 is not filled by conductive layers 218 and dielectric layers 220, leaving recesses 222 and 224 in notches 206 and 208, respectively.

Method 300 proceeds to operation 308, as illustrated in FIG. 3, in which a portion of the substrate is removed to expose the interleaved conductive layers and dielectric layers below the semiconductor layer. In some embodiments, to remove the portion of the substrate, an etch stop layer is deposited over the interleaved conductive layers and dielectric layers, and the substrate is thinned until being stopped by the etch stop layer. The etch stop layer can include polysilicon. In some embodiments, the portion of the substrate is removed, such that the bottom surface and a portion of the side surface of the notch are removed.

Figure 2E:
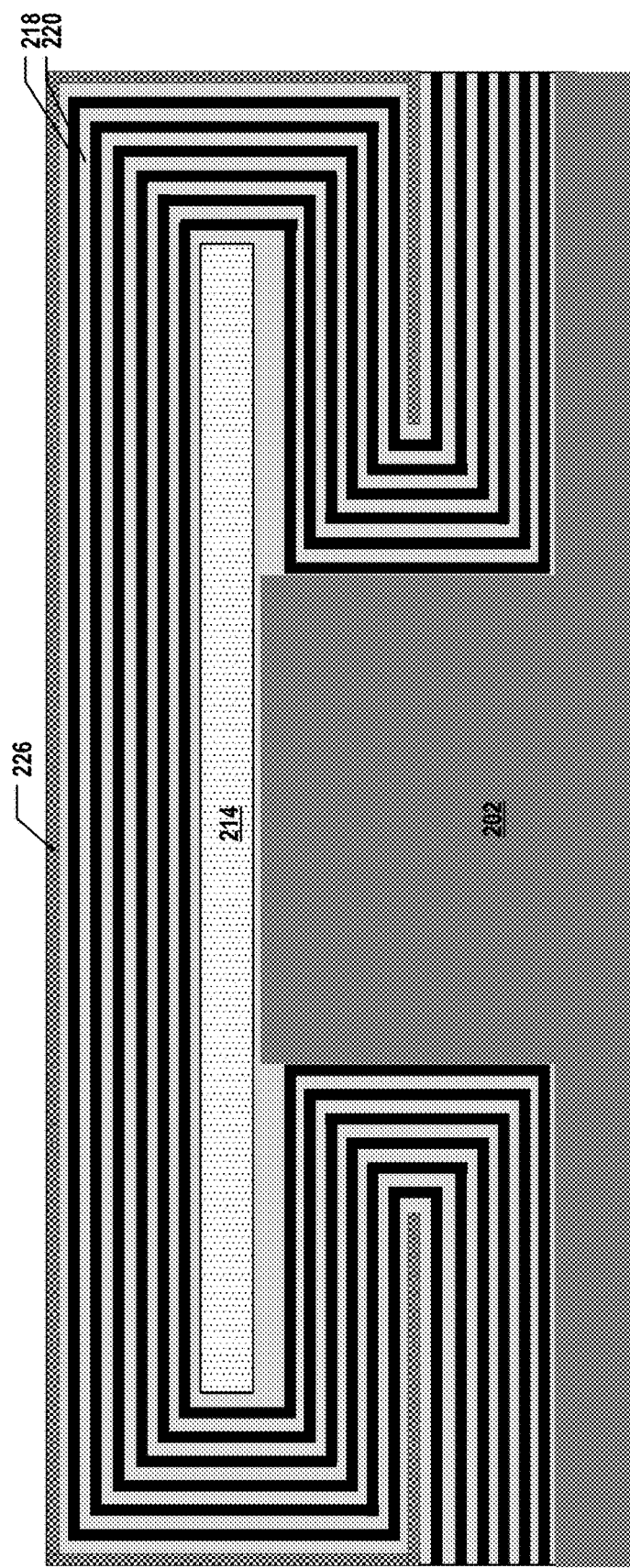

As illustrated in FIG. 2E, an etch stop layer 226 is deposited over interleaved conductive layers 218 and dielectric layers 220. In some embodiments, etch stop layer 226 includes polysilicon. Etch stop layer 226 can be deposited by one or more thin film deposition processes including, but not limited to, CVD, PVD, ALD, electroplating, electrodeless plating, or any combination thereof. In some embodiments, etch stop layer 226 can be deposited using ALD, such that etch stop layer 226 can be conformably coated to fill recesses 222 and 224 (as shown in FIG. 2D) as well.

Figure 2F:
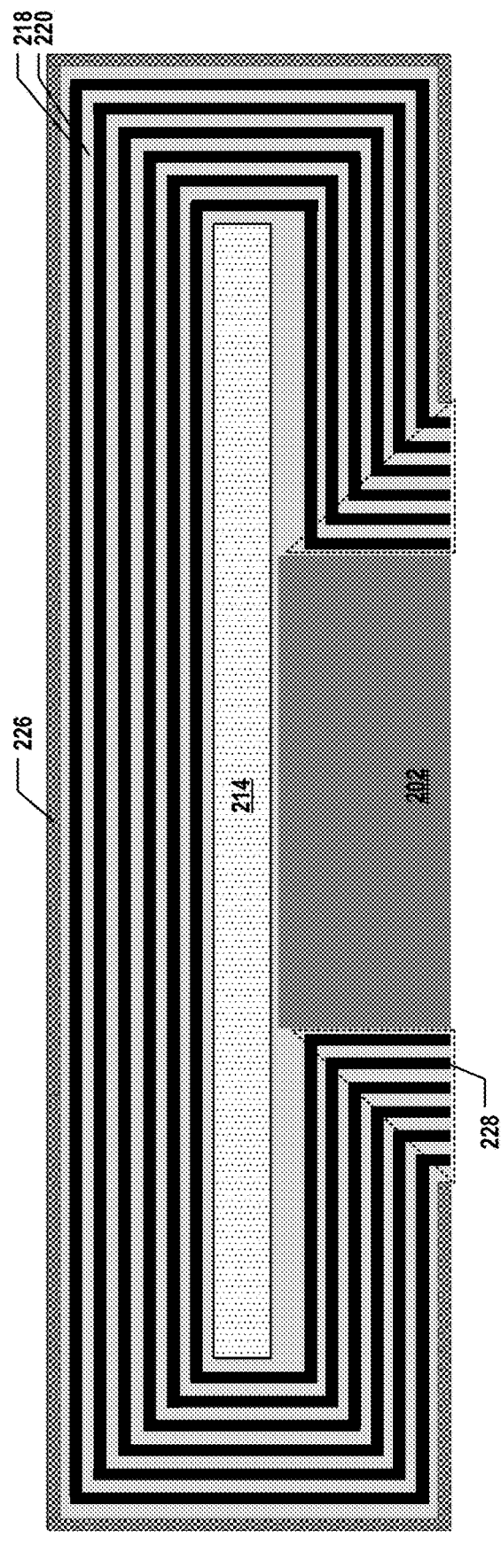

As illustrated in FIG. 2F, a portion of substrate 202 is removed to expose interleaved conductive layers 218 (e.g., functioning as word line contacts 228) and dielectric layers 220 below semiconductor layer 214. Substrate 202 can be thinned until being stopped by the etch stop layer 226. In some embodiments, substrate 202 is thinned by CMP, dry etching, and/or wet etching, and etch stop layer 226 works as the CMP etch stop layer and/or the hard mask for wet etching. In some embodiments, the portion of substrate 202 is removed, such that the bottom surface and a portion of the side surface of notch 206 or 208 are removed. The degree of thinning can be controlled by etch stop layer 226. For example, the part of substrate 202 below etch stop layer 226 and the part of interleaved conductive layers 218 and dielectric layers 220 below etch stop layer 226 may be removed to expose word line contacts 228 (i.e., part of conductive layers 218 extending vertically below the back side of semiconductor layer 214). Etch stop layer 226 is removed, for example, by wet etching and/or dry etching, after the thinning of substrate 202, according to some embodiments.

Referring back to operation 306 of method 300 in FIG. 3, in some embodiments, to form the plurality of interleaved conductive layers and dielectric layers, a plurality of sacrificial layers and the dielectric layers are alternatingly deposited along a front side and the at least one edge of the semiconductor layer and along a top surface, a side surface, and a bottom surface of the notch, and the sacrificial layers are replaced with a plurality of conductive layers. The plurality of sacrificial layers and dielectric layers can be alternatingly deposited using ALD. In some embodiments, each of the sacrificial layers includes silicon nitride, each of the dielectric layers includes silicon oxide, and each of the conductive layers includes a metal. At operation 308, in some embodiments, a portion of the substrate is removed to expose the interleaved sacrificial layers and dielectric layers below the semiconductor layer. To remove the portion of the substrate, an etch stop layer can be deposited over the interleaved sacrificial layers and dielectric layers, and the substrate can be thinned until being stopped by the etch stop layer.

As illustrated in FIG. 2D, in some embodiments, a plurality of sacrificial layers 218 and dielectric layers 220 are formed along the front side and both edges of semiconductor layer 214 and along the top surface, the side surface, and the bottom surface of each notch 206 or 208 (as shown in FIG. 2C). Each sacrificial layer 218 can include a first dielectric, such as silicon nitride, and each dielectric layer 220 can include a second dielectric other than the first dielectric, such as silicon oxide. Sacrificial layers 218 and dielectric layers 220 can be alternatingly deposited by one or more thin film deposition processes including, but not limited to, CVD, PVD, ALD, electroplating, electrodeless plating, or any combination thereof. The deposition rate and/or deposition time can be controlled to control the thickness of each sacrificial layer 218 and each dielectric layer 220. In some embodiments, the combined thickness of each pair of sacrificial layer 218 and dielectric layer 220 is nominally the same. As described above, the combined thickness of each pair of sacrificial layer 218 and dielectric layer 220 is less than one half of the depth of each notch 206 or 208 such that at least one pair of sacrificial layer 218 and dielectric layer 220 can be formed in notches 206 and 208, according to some embodiments.

In some embodiments, sacrificial layers 218 and dielectric layers 220 are alternatingly deposited using ALD. Sacrificial layers 218 and dielectric layers 220 with well-controlled thickness and surface uniformity can be deposited using ALD along the front side and both edges of semiconductor layer 214 as well as along the top surface, the side surface, and the bottom surface of each notch 206 or 208. That is, a stack of continuous layers can be conformally deposited, following the profiles of semiconductor layer 214 and substrate 202, using ALD. In some embodiments, part of each notch 206 or 208 is not filled by sacrificial layers 218 and dielectric layers 220, leaving recesses 222 and 224 in respective notch 206 or 208.

As illustrated in FIG. 2E, in some embodiments, etch stop layer 226 is deposited over interleaved sacrificial layers 218 and dielectric layers 220. In some embodiments, etch stop layer 226 includes polysilicon. Etch stop layer 226 can be deposited by one or more thin film deposition processes including, but not limited to, CVD, PVD, ALD, electroplating, electrodeless plating, or any combination thereof. In some embodiments, etch stop layer 226 can be deposited using ALD, such that etch stop layer 226 can be conformably coated to fill recesses 222 and 224 (as shown in FIG. 2D) as well.

As illustrated in FIG. 2F, in some embodiments, a portion of substrate 202 is removed to expose interleaved sacrificial layers 218 and dielectric layers 220 below semiconductor layer 214. Substrate 202 can be thinned until being stopped by the etch stop layer 226. In some embodiments, substrate 202 is thinned by CMP, dry etching, and/or wet etching, and etch stop layer 226 works as the CMP etch stop layer and/or the hard mask for wet etching. In some embodiments, the portion of substrate 202 is removed, such that the bottom surface and a portion of the side surface of notch 206 or 208 are removed. The degree of thinning can be controlled by etch stop layer 226. For example, the part of substrate 202 below etch stop layer 226 and the part of interleaved sacrificial layers 218 and dielectric layers 220 below etch stop layer 226 may be removed to expose part of sacrificial layers 218 extending vertically below the back side of semiconductor layer 214. Etch stop layer 226 is removed, for example, by wet etching and/or dry etching, after the thinning of substrate 202, according to some embodiments.

Figure 2G:
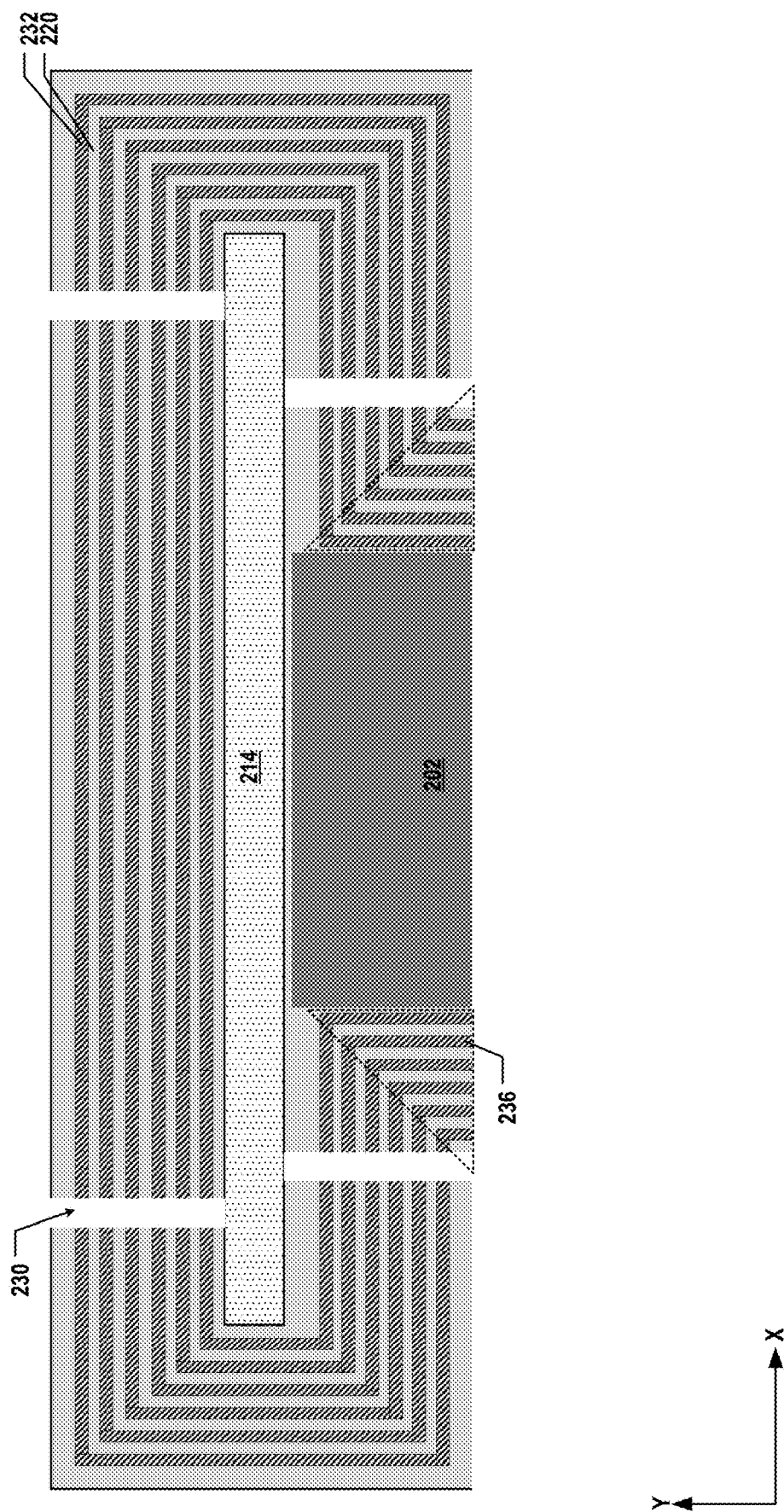

As illustrated in FIG. 2G, in some embodiments, one or more slit openings 230 are formed each extending vertically through interleaved sacrificial layers 218 and dielectric layers 220. Slit openings 230 can be formed by wet etching and/or dry etching processes, such as deep RIE to form pathways for the subsequent gate-replacement process that replaces sacrificial layers 218 (as shown in FIG. 2F) with conductive layers 232. The replacement of sacrificial layers 218 with conductive layers 232 can be performed by wet etching sacrificial layers 218 (e.g., silicon nitride) selective to dielectric layers 220 (e.g., silicon oxide) and filling the structure with conductive layers 232. Conductive layers 232 can include a metal, such as tungsten. Conductive layers 232 can be deposited by PVD, CVD, ALD, any other suitable process, or any combination thereof. As a result, after the gate replacement process, the part of sacrificial layers 218 extending vertically below the back side of semiconductor layer 214 can become word line contacts 236.

It is understood that details of forming other components of the 3D memory device (e.g., NAND memory strings, local interconnects, and peripheral devices) can be readily appreciated and thus, are not described herein. For example, at least some of the NAND memory strings and local interconnects may be formed after the interleaved conductive layers and dielectric layers deposition and prior to the backside thinning of the substrate.

According to one aspect of the present disclosure, a method for forming a 3D memory device is disclosed. A notch is formed on at least one edge of a substrate. A semiconductor layer above the substrate and extending laterally beyond the at least one edge of the substrate is formed to cover the notch. A plurality of interleaved conductive layers and dielectric layers are formed along a front side and the at least one edge of the semiconductor layer and along a top surface, a side surface, and a bottom surface of the notch. A portion of the substrate is removed to expose the interleaved conductive layers and dielectric layers below the semiconductor layer.

In some embodiments, to form the notch, two notches are formed on both edges of the substrate, respectively.

In some embodiments, a depth of the notch is greater than twice of a combined thickness of the conductive layer and the dielectric layer.

In some embodiments, to form the semiconductor layer, the notch is filled with a notch sacrificial layer, the semiconductor layer is deposited above the substrate and the notch sacrificial layer, and the notch sacrificial layer in the notch is removed.

In some embodiments, a thickness of the semiconductor layer is not greater than 1 µm. In some embodiments, the semiconductor layer includes polysilicon.

In some embodiments, to form the plurality of interleaved conductive layers and dielectric layers, the plurality of conductive layers and dielectric layers are alternatingly deposited using ALD. In some embodiments, each of the conductive layers includes doped polysilicon, and each of the dielectric layers includes silicon oxide.

In some embodiments, to form the plurality of interleaved conductive layers and dielectric layers, a plurality of sacrificial layers and the dielectric layers are alternatingly deposited using ALD, and the sacrificial layers are replaced with the conductive layers. In some embodiments, each of the sacrificial layers includes silicon nitride, each of the dielectric layers comprises silicon oxide, and each of the conductive layers includes a metal.

In some embodiments, to remove the portion of the substrate, an etch stop layer is deposited over the interleaved conductive layers and dielectric layers, and the substrate is thinned until being stopped by the etch stop layer. In some embodiments, the etch stop layer includes polysilicon.

In some embodiments, the portion of the substrate is removed, such that the bottom surface and a portion of the side surface of the notch are removed.

According to another aspect of the present disclosure, a method for forming a 3D memory device is disclosed. A notch is formed on at least one edge of a substrate. A semiconductor layer above the substrate and extending laterally beyond the at least one edge of the substrate is formed to cover the notch. A plurality of sacrificial layers and dielectric layers are alternatingly deposited along a front side and the at least one edge of the semiconductor layer and along a top surface, a side surface, and a bottom surface of the notch. A portion of the substrate is removed to expose the interleaved sacrificial layers and dielectric layers below the semiconductor layer. The sacrificial layers are replaced with a plurality of conductive layers.

In some embodiments, the plurality of sacrificial layers and dielectric layers are alternatingly deposited using ALD.

In some embodiments, each of the sacrificial layers includes silicon nitride, each of the dielectric layers includes silicon oxide, and each of the conductive layers includes a metal.

In some embodiments, to form the semiconductor layer, the notch is filled with a notch sacrificial layer, the semiconductor layer is deposited above the substrate and the notch sacrificial layer, and the notch sacrificial layer in the notch is removed.

In some embodiments, to remove the portion of the substrate, an etch stop layer is deposited over the interleaved sacrificial layers and dielectric layers, and the substrate is thinned until being stopped by the etch stop layer.

According to still another aspect of the present disclosure, a method for forming a 3D memory device is disclosed. A notch is formed on at least one edge of a substrate. A semiconductor layer above the substrate and extending laterally beyond the at least one edge of the substrate is formed to cover the notch. A plurality of conductive layers and dielectric layers are alternatingly deposited along a front side and the at least one edge of the semiconductor layer and along a top surface, a side surface, and a bottom surface of the notch. A portion of the substrate is removed to expose the interleaved conductive layers and dielectric layers below the semiconductor layer.

In some embodiments, the plurality of conductive layers and dielectric layers are alternatingly deposited using ALD.

In some embodiments, each of the conductive layers includes doped polysilicon, and each of the dielectric layers includes silicon oxide.

In some embodiments, to form the semiconductor layer, the notch is filled with a notch sacrificial layer, the semiconductor layer is deposited above the substrate and the notch sacrificial layer, and the notch sacrificial layer in the notch is removed.

In some embodiments, to remove the portion of the substrate, an etch stop layer is deposited over the interleaved conductive layers and dielectric layers, and the substrate is thinned until being stopped by the etch stop layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming a notch on at least one edge of a substrate;
   forming a semiconductor layer above the substrate and extending laterally beyond the at least one edge of the substrate to cover the notch;
   forming a plurality of interleaved conductive layers and dielectric layers along a front side and the at least one edge of the semiconductor layer and along a top surface, a side surface, and a bottom surface of the notch; and
   removing a portion of the substrate to expose the interleaved conductive layers and dielectric layers below the semiconductor layer.

2. The method of claim 1, wherein forming the notch comprises forming two notches on both edges of the substrate, respectively.

3. The method of claim 1, wherein a depth of the notch is greater than twice of a combined thickness of the conductive layer and the dielectric layer.

4. The method of claim 1, wherein forming the semiconductor layer comprises:
   filling the notch with a notch sacrificial layer;
   depositing the semiconductor layer above the substrate and the notch sacrificial layer; and removing the notch sacrificial layer in the notch.

5. The method of claim 1, wherein a thickness of the semiconductor layer is not greater than 1 μm.

6. The method of claim 1, wherein the semiconductor layer comprises polysilicon.

7. The method of claim 1, wherein forming the plurality of interleaved conductive layers and dielectric layers comprises alternatingly depositing the plurality of conductive layers and dielectric layers using atomic layer deposition (ALD).

8. The method of claim 7, wherein each of the conductive layers comprises doped polysilicon, and each of the dielectric layers comprises silicon oxide.

9. The method of claim 1, wherein forming the plurality of interleaved conductive layers and dielectric layers comprises:
   alternatingly depositing a plurality of sacrificial layers and the dielectric layers using ALD; and
   replacing the sacrificial layers with the conductive layers.

10. The method of claim 9, wherein each of the sacrificial layers comprises silicon nitride, each of the dielectric layers comprises silicon oxide, and each of the conductive layers comprises a metal.

11. The method of claim 1, wherein removing the portion of the substrate comprises:
   depositing an etch stop layer over the interleaved conductive layers and dielectric layers; and
   thinning the substrate until being stopped by the etch stop layer.

12. The method of claim 11, wherein the etch stop layer comprises polysilicon.

13. The method of claim 1, wherein the portion of the substrate is removed, such that the bottom surface and a portion of the side surface of the notch are removed.

14. A method for forming a three-dimensional (3D) memory device, comprising:
   forming a notch on at least one edge of a substrate;
   forming a semiconductor layer above the substrate and extending laterally beyond the at least one edge of the substrate to cover the notch;
   alternatingly depositing a plurality of sacrificial layers and dielectric layers along a front side and the at least one edge of the semiconductor layer and along a top surface, a side surface, and a bottom surface of the notch;
   removing a portion of the substrate to expose the interleaved sacrificial layers and dielectric layers below the semiconductor layer; and
   replacing the sacrificial layers with a plurality of conductive layers.

15. The method of claim 14, wherein the plurality of sacrificial layers and dielectric layers are alternatingly deposited using atomic layer deposition (ALD).

16. The method of claim 14, wherein each of the sacrificial layers comprises silicon nitride, each of the dielectric layers comprises silicon oxide, and each of the conductive layers comprises a metal.

17. The method of claim 14, wherein removing the portion of the substrate comprises:
   depositing an etch stop layer over the interleaved sacrificial layers and dielectric layers; and
   thinning the substrate until being stopped by the etch stop layer.

18. A method for forming a three-dimensional (3D) memory device, comprising:
   forming a notch on at least one edge of a substrate;
   forming a semiconductor layer above the substrate and extending laterally beyond the at least one edge of the substrate to cover the notch;
   alternatingly depositing a plurality of conductive layers and dielectric layers along a front side and the at least one edge of the semiconductor layer and along a top surface, a side surface, and a bottom surface of the notch; and
   removing a portion of the substrate to expose the interleaved conductive layers and dielectric layers below the semiconductor layer.

19. The method of claim 18, wherein the plurality of conductive layers and dielectric layers are alternatingly deposited using atomic layer deposition (ALD).

20. The method of claim 18, wherein each of the conductive layers comprises doped polysilicon, and each of the dielectric layers comprises silicon oxide.

* * * * *